United States Patent
Levy et al.

(10) Patent No.: US 7,898,852 B1
(45) Date of Patent: Mar. 1, 2011

(54) TRAPPED-CHARGE NON-VOLATILE MEMORY WITH UNIFORM MULTILEVEL PROGRAMMING

(75) Inventors: Sagy Levy, Zichron Yaakov (IL); Krishnaswamy Ramkumar, San Jose, CA (US); Peter Voss, Aromas, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 261 days.

(21) Appl. No.: 12/005,803

(22) Filed: Dec. 27, 2007

(51) Int. Cl.
*G11C 16/04* (2006.01)

(52) U.S. Cl. ......... 365/185.03; 365/185.05; 365/185.24

(58) Field of Classification Search ............. 365/185.03, 365/185.05, 185.14, 185.24
See application file for complete search history.

(56) References Cited

U.S. PATENT DOCUMENTS

| | | | |
|---|---|---|---|
| 4,395,438 A | 7/1983 | Chiang | |
| 4,490,900 A | 1/1985 | Chiu | |
| 4,870,470 A | 9/1989 | Bass et al. | |
| 5,408,115 A | 4/1995 | Chang | |
| 5,464,783 A | 11/1995 | Kim et al. | |
| 5,937,323 A | 8/1999 | Orczyk et al. | |
| 5,939,333 A | 8/1999 | Hurley et al. | |
| 5,972,804 A | 10/1999 | Tobin et al. | |
| 5,999,454 A | 12/1999 | Smith | |
| 6,020,606 A | 2/2000 | Liao | |
| 6,150,286 A | 11/2000 | Sun et al. | |
| 6,162,700 A | 12/2000 | Hwang et al. | |
| 6,217,658 B1 | 4/2001 | Orczyk et al. | |
| 6,268,299 B1 | 7/2001 | Jammy et al. | |
| 6,297,173 B1 | 10/2001 | Tobin et al. | |
| 6,335,288 B1 | 1/2002 | Kwan et al. | |
| 6,348,380 B1 | 2/2002 | Weimer et al. | |
| 6,399,484 B1 | 6/2002 | Yamasaki et al. | |
| 6,406,960 B1 | 6/2002 | Hopper et al. | |
| 6,445,030 B1 | 9/2002 | Wu et al. | |
| 6,468,927 B1 | 10/2002 | Zhang et al. | |
| 6,559,026 B1 | 5/2003 | Rossman et al. | |
| 6,586,343 B1 | 7/2003 | Ho et al. | |
| 6,602,771 B2 | 8/2003 | Inoue et al. | |
| 6,709,928 B1 | 3/2004 | Jenne et al. | |
| 6,713,127 B2 | 3/2004 | Subramony et al. | |
| 6,735,124 B1 * | 5/2004 | Melik-Martirosian et al. ............... | 365/185.28 |
| 6,818,558 B1 | 11/2004 | Rathor et al. | |
| 6,851,017 B2 * | 2/2005 | Horiguchi et al. ............ | 711/106 |
| 6,917,072 B2 | 7/2005 | Noguchi et al. | |
| 7,075,830 B2 * | 7/2006 | Lee et al. ................. | 365/185.28 |
| 7,301,185 B2 | 11/2007 | Chen et al. | |
| 7,312,495 B2 * | 12/2007 | Zheng ........................... | 257/314 |

(Continued)

OTHER PUBLICATIONS

Alvaro Padilla et al., "Dual-bit SONOS FinFET Non-Volatile Memory Cell and New Method of Charge Detection", Department of Electrical Engineering and Computer Sciences, Universicty of California At Berkeley, Berkeley, CA 94720-1770, 1-4244-0585-8/07, 2007 IEEE, pp. 2 total.

(Continued)

*Primary Examiner* — Richard Elms
*Assistant Examiner* — Hien N Nguyen

(57) ABSTRACT

Methods and apparatus for programming and sensing a bi-nitride layer trapped-charge memory device in one of a first and second programmed states or one of a first and second erased states, where the first and second programmed states correspond to first and second uniform trapped charge distributions of a first charge type and the first and second erased states correspond to first and second uniform trapped charge distributions of a second charge type.

20 Claims, 15 Drawing Sheets

U.S. PATENT DOCUMENTS

| | | | |
|---|---|---|---|
| 7,338,869 B2 | 3/2008 | Fukuda et al. | |
| 7,466,613 B2 | 12/2008 | Li et al. | |
| 7,535,053 B2 | 5/2009 | Yamazaki | |
| 7,601,576 B2 | 10/2009 | Suzuki et al. | |
| 2005/0253189 A1 | 11/2005 | Cho et al. | |
| 2006/0086953 A1 | 4/2006 | Lee et al. | |
| 2007/0230247 A1* | 10/2007 | Hsu et al. | 365/185.14 |
| 2008/0205141 A1* | 8/2008 | Lee et al. | 365/185.03 |
| 2008/0266977 A1* | 10/2008 | Wu | 365/185.24 |
| 2009/0244969 A1* | 10/2009 | Maejima | 365/185.03 |

OTHER PUBLICATIONS

Chang Woo Oh et al., "4-Bit Double SONOS Memories (DSMs) Using Single-Level and Multi-Level Cell Schemes", Device Research Team, PDT* and MTT**, R&D Center, Samsung Electronics Co., Korea, Electron Devices Meeting, 2006 IEDM '06 International, Dec. 11-13, 2006, pp. 5 total (includes date identifier page).

Myung Kwan Cho et al., "Simultaneous Hot-Hole Injection at Drain and Source for Efficient Erase and Excellent Endurance in SONOS Flash EEPROM Cells", IEEE Electron Device Letters, vol. 24, No. 4, Apr. 2003, pp. 260-262.

Yong Kyu Lee et al., Twin-Bit Silicon-Oxide-Nitride-Oxide-Silicon (SONOS) Memory by Inverted Sidewall Patterning (TSM-ISP), IEEE Transactions on Nanotechnology, vol. 2, No. 4, Dec. 2003, pp. 246-252.

T. Sugizaki et al., "Novel Multi-bit SONOS Type Flash Memory Using a High-k Charge Trapping Layer", Fujitsu Laboratories Ltd, Japan, 2003 Symposium on VLSI Technology Digest of Technical Papers, pp. 2 total.

Woei-Cherng Wu et al., "Highly Reliable Multilevel and 2-bit/cell Operation of Wrapped Select Gate (WSG) SONOS Memory", IEEE Electron Device Letters, vol. 28, No. 3, Mar. 2007, pp. 214-216.

Huiqing Pang et al., "Trapped Charge Distribution during the P/E Cycling of SONOS Memory", Institute of Microelectronics, Beijing, China, Proceedings of 13th IPFA 2006, Singapore, pp. 84-87.

Choi et al., "Investigation of Lateral Charge Distribution of 2-bit SONOS Memory Devices using Physically Separated Twin SONOS Structure," 2000 ICMTS, IEEE International Conference on Microelectronic Test Structures, Mar. 6-9, 2006, pp. 47-50; 4 pages.

USPTO Notice of Allowance for U.S. Appl. No. 10/185,470 dated Jul. 16, 2004; 4 pages.

USPTO Non-Final Rejection for U.S. Appl. No. 10/185,470 dated Feb. 24, 2004; 6 pages.

USPTO Non-Final Rejection for U.S. Appl. No. 10/185,470 dated Oct. 16, 2003; 7 pages.

USPTO Requirement for Restriction/Election for U.S. Appl. No. 11/904,506 dated Apr. 13, 2010; 7 pages.

International Search Report and Written Opinion of the International Searching Authority for International Application No. PCT/US07/20966, mailed Apr. 21, 2008; 11 pages.

Chen et al., "Performance Improvement of SONOS Memory by Bandgap Engineering of Charge-Trapping Layer," IEEE Electron Device Letters, Apr. 2004, vol. 25, No. 4, pp. 205-207; 3 pages.

Lue et al., "BE-SONOS: A Bandgap Engineered SONOS with Excellent Performance and Reliability," IEEE, 2005; 4 pages.

Lue et al., "Reliability Model of Bandgap Engineered SONOS (BE-SONOS)," IEEE, 2006; 4 pages.

Wang et al., "Reliability and Processing Effects of Bandgap Engineered SONOS (BE-SONOS) Flash Memory," 2007, IEEE International Reliability Symposium, Apr. 2007; 5 pages.

Wu et al., "SONOS Device with Tapered Bandgap Nitride Layer," IEEE Transactions on Electron Devices, May 2005, vol. 52, No. 5, pp. 987-992; 6 pages.

USPTO Notice of Allowance for U.S. Appl. No. 09/920,378 dated Nov. 10, 2003; 5 pages.

USPTO Advisory Action for U.S. Appl. No. 09/920,378 dated Sep. 5, 2003; 3 pages.

USPTO Advisory Action for U.S. Appl. No. 09/920,378 dated Jun. 25, 2003; 3 pages.

USPTO Final Rejection for U.S. Appl. No. 09/920,378 dated Mar. 28, 2003; 6 pages.

USPTO Non-Final Rejection for U.S. Appl. No. 09/920,378 dated Oct. 21, 2002; 10 pages.

USPTO Requirement for Restriction/Election for U.S. Appl. No. 09/920,378 dated Jul. 22, 2002; 4 pages.

Milton Ohring, "The Materials Science of Thin Films: Deposition and Structure," 2nd Edition, Academic Press, 2002, pp. 336-337; 4 pages.

* cited by examiner

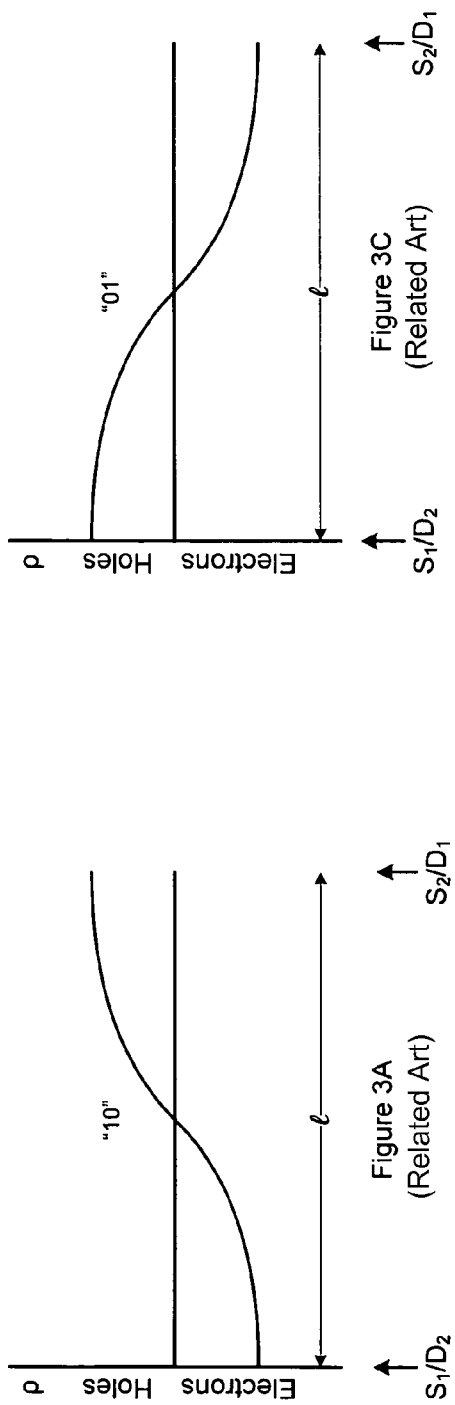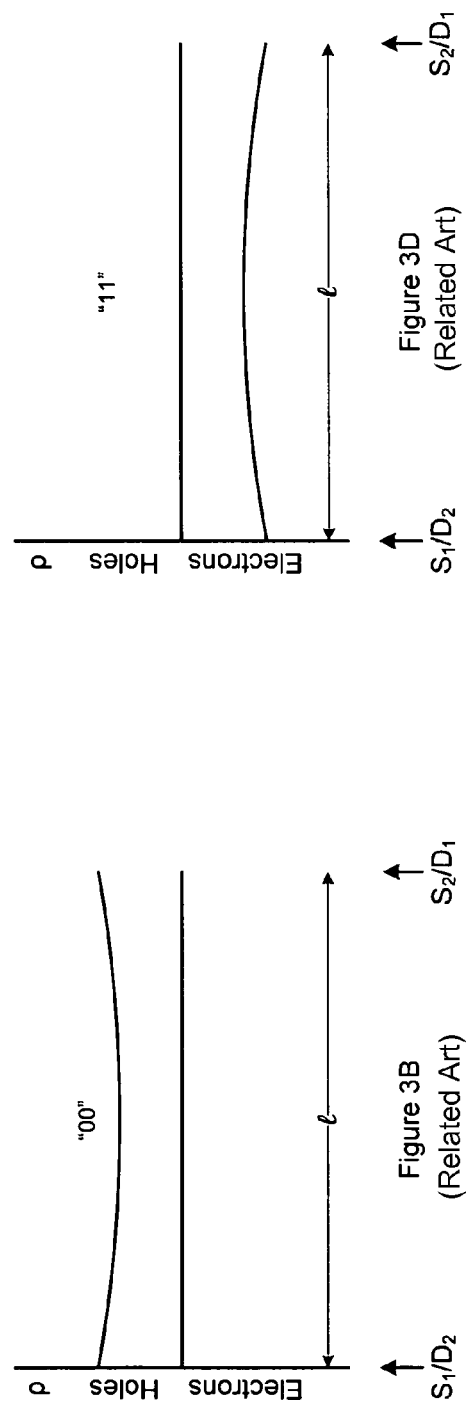

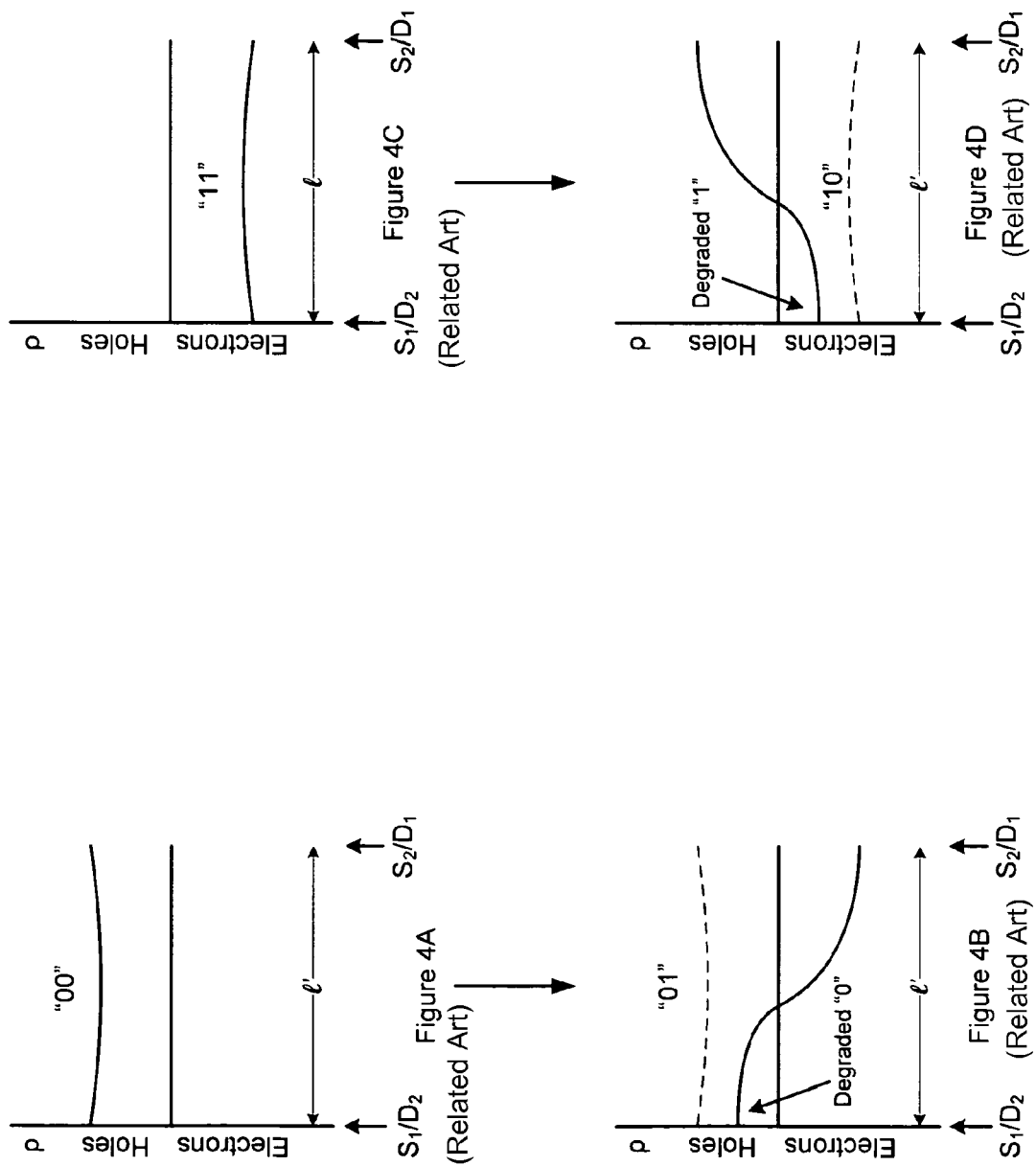

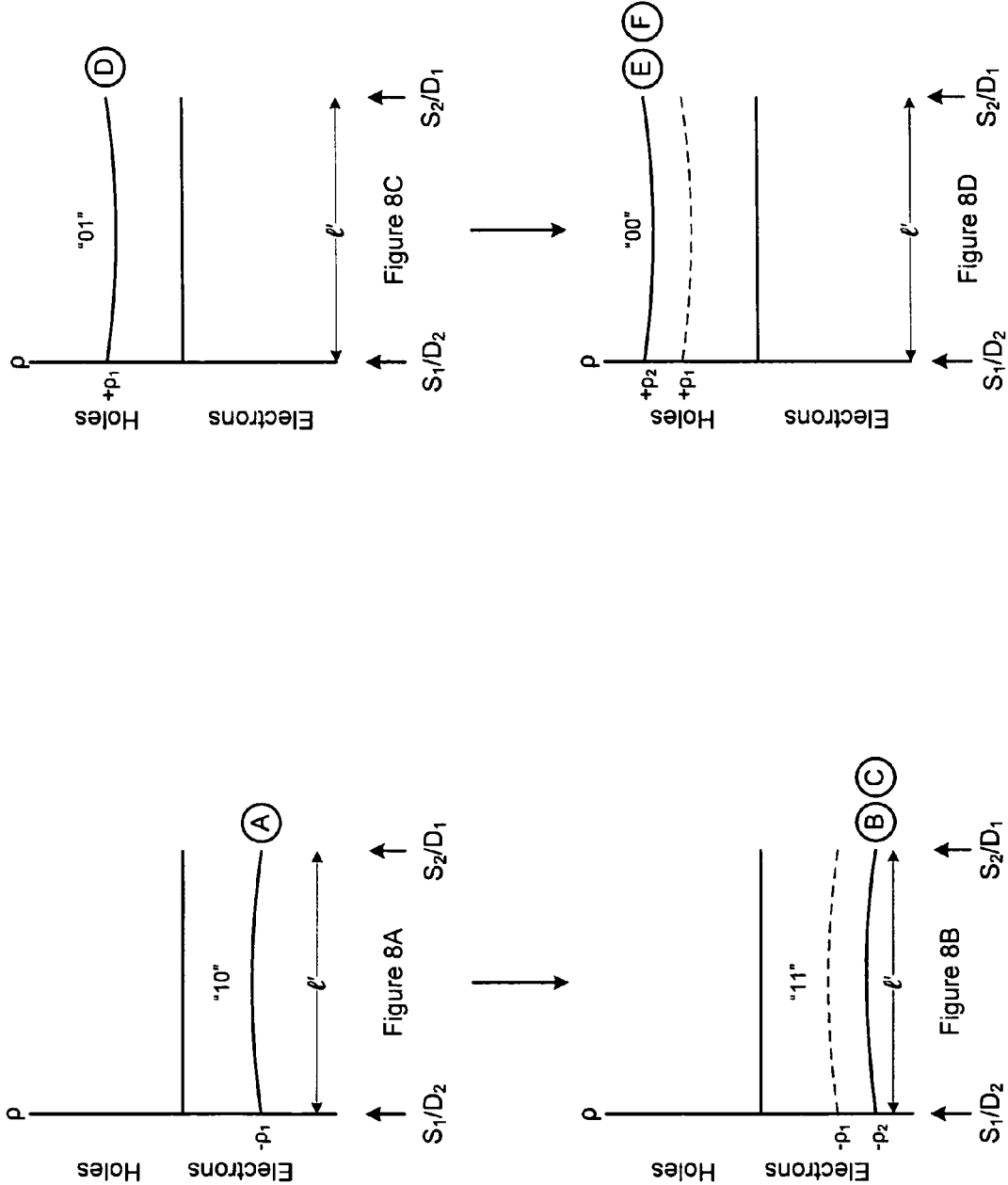

| | V1 | V2 | V3 | V4 | DATA "A" | DATA "B" |
|---|---|---|---|---|---|---|
| $V_{SENSE} < V_{REF1}$ | HI | HI | LO | LO | 1 | 1 |
| $V_{REF1} < V_{SENSE} < V_{REF2}$ | LO | HI | LO | HI | 1 | 0 |
| $V_{REF2} < V_{SENSE} < V_{REF3}$ | LO | LO | HI | HI | 0 | 1 |
| $V_{SENSE} > V_{REF3}$ | LO | LO | LO | HI | 0 | 0 |

Figure 9C

TRAPPED-CHARGE NON-VOLATILE MEMORY WITH UNIFORM MULTILEVEL PROGRAMMING

FIELD OF INVENTION

Embodiments of the present invention relate to non-volatile solid-state memory and, in particular, to multi-bit trapped-charge solid-state memory.

BACKGROUND

Non-volatile solid-state memory is used in many electronic components, devices and systems to provide programmable data storage that is retained without the need for an external power source. One well-known type of non-volatile solid-state memory is based on floating gate device technology. A floating gate device is a type of metal-oxide-semiconductor field-effect transistor (MOSFET) that uses a conductive, but insulated floating gate, between a conventional control gate and the channel, to store charge. Another type of non-volatile solid-state memory is based on SONOS (silicon-oxide-nitride-oxide-silicon) devices. SONOS devices provide several advantages over conventional floating-gate memories, including immunity from single point failures and programming at lower voltages. In contrast to floating-gate devices, which store charge on a conductive floating gate, SONOS devices trap charge in a dielectric layer. SONOS transistors are programmed and erased using a quantum mechanical effect known as uniform channel modified Fowler-Nordheim tunneling. This method of programming and erase is known in the art to provide better reliability than other methods of charge storage such as hot carrier injection. A SONOS transistor is a type of MOSFET with a charge-trapping dielectric stack (ONO stack) between a conventional control gate and a channel in the body of the transistor. A SONOS transistor can be fabricated as a P-type or N-type MOSFET using CMOS (complementary metal-oxide-semiconductor) fabrications methods A SONOS transistor can be programmed or erased by applying a voltage of the proper polarity, magnitude and duration between the control gate and the channel of the device. A positive gate-to-channel voltage causes electrons to tunnel from the channel through an oxide layer (tunnel oxide) to a charge-trapping dielectric layer and a negative gate-to-channel voltage causes holes to tunnel from the channel through the tunnel oxide to the charge-trapping dielectric layer. The trapped charge modulates the threshold voltage of the device. In one case, the threshold voltage of the transistor is raised and in the other case the threshold voltage of the transistor is lowered. The threshold voltage is the gate-to-source voltage that causes the transistor to conduct current between drain and source when a voltage is applied between the drain and source terminals.

Typically, a SONOS transistor is used to store one bit of information, either a logical "0" or a logical "1," associated with a uniform trapped-charge density corresponding to the programmed and erased states (the choice of which state corresponds to which logic level is arbitrary). The state of the transistor is read by applying a gate voltage with a value that is between the erased threshold voltage and the programmed threshold voltage and sensing the current that flows between the drain and source under an applied drain-to-source voltage. In one state the transistor conducts current and in the other state the transistor does not conduct current.

The quality of a SONOS memory device is measured by its endurance and data retention. Endurance is the number of program/erase cycles (e.g., 1 million) that a device can undergo while maintaining a specified separation (memory window) between the programmed threshold voltage and the erased threshold voltage. Data retention is the period of time following endurance cycling that a device maintains another specified memory window. A large memory window reduces data errors when reading the device.

In order to increase data storage densities, two-bit SONOS devices have been designed and fabricated that rely on the non-conductive characteristics of the charge-trapping dielectric layer. In these devices, the type and density of the trapped charge is controlled independently at the edges of the device. FIG. 1A illustrates a simplified cross-section (not to scale) of a conventional N-type SONOS device. The SONOS device is fabricated on a diffused P-well in an N-type substrate. Two N+ source/drain diffusions provide ohmic contacts and define a channel region. A tunnel oxide layer is grown above the channel, followed by the trapping oxide layer, a blocking oxide layer and a control gate. A P+ diffusion in the P-well provides an ohmic contact for bulk programming and erase operations.

FIG. 1B illustrates how a conventional SONOS device can be used to provide 2-bit programming functionality. In FIG. 1B, a negative voltage is applied between one source/drain contact on the left and the control gate, and a positive voltage is applied between the other source/drain contact on the right and the control gate. The negative voltage creates an electric field that causes electrons to tunnel from the channel, through the tunnel oxide, to the trapping oxide layer. The positive voltage creates an electric field that causes electrons to tunnel from the trapping oxide layer, through the tunnel oxide layer, to the channel (the tunneling of electrons in one direction is equivalent to the tunneling of holes in the opposite direction). The amount of charge transport is greatest at the edges of the tunnel oxide layer where the electric field strength is greatest.

FIG. 1C illustrates the state of the SONOS device after the programming voltages are removed. The trapped electrons on the left side of the device repel electrons from the channel, depleting the channel and leaving a positive space charge. The trapped holes on the right side of the device attract electrons to the channel, which inverts the channel. In this state, the device has a positive threshold voltage on the left and a negative threshold voltage on the right. The positive and negative threshold voltages can be associated with a "1" and "0" respectively.

FIG. 2A illustrates the trapped charge density profile across the length (l) of the trapping oxide layer, corresponding to the "10" programmed state of the SONOS device in FIG. 1C. FIGS. 2B, 2C and 2D correspond to the other possible states of the device as a function of the selection of programming voltages. This approach to 2-bit SONOS programming works as long as the charge densities on opposite ends of the trapping layer can be independently controlled. At sufficiently small device geometries, however, this approach breaks down because the charges and programming voltages interact. FIGS. 3A through 3D illustrate the effect of a short channel geometry on conventional 2-bit SONOS programming.

FIG. 3A illustrates the charge profile of a short channel SONOS device programmed to a "00" state, where holes are trapped in both ends of the trapping oxide layer. In FIG. 3B, the right side of the device has been re-programmed to a "1" state by the application of a negative source-to-gate voltage that causes electrons to tunnel into the trapping oxide layer (the previous charge density profile is shown as a dotted line in FIG. 3B). However, as illustrated in FIG. 3B, the density of trapped holes on the left side of the device has also been depleted by the re-programming voltage on the right side. As a result, the magnitude of the threshold voltage on the left side of the device is reduced and the quality of the "0" is degraded.

FIGS. 3C and 3D illustrate the comparable effect when a short channel SONOS device is programmed to a "11" state and one side is re-programmed to a "0" state. In this case, the quality of the "1" on the other side of the device is degraded by a depletion of trapped electrons and a reduction in the magnitude of the threshold voltage on that side of the device.

BRIEF DESCRIPTION OF THE DRAWINGS

Embodiments of the present invention are illustrated by way of example, and not limitation, in the figures of the accompanying drawings in which:

FIGS. 3A through 3D illustrate charge trapping profiles across a channel length associated with conventional 2-bit programming in a conventional SONOS device;

FIGS. 4A-4D illustrate charge trapping profiles across a short channel length SONOS device for conventional 2-bit programming associated with degraded data quality;

FIGS. 8A through 8D illustrate multilevel trapped charge profiles across a short channel length SONOS-type device in one embodiment;

FIG. 9C is a truth table illustrating 2-bit data readout of the embodiment of FIG. 9B;

DETAILED DESCRIPTION

Methods and apparatus for multilevel programming of a bilayer oxynitride trapping layer SONOS-type device are described. In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention.

Figure 1A:
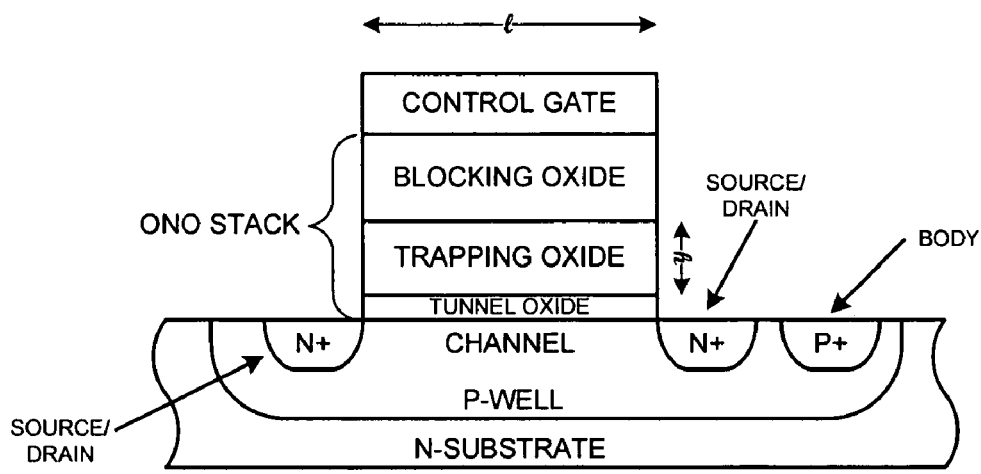
FIG. 1A illustrates a conventional SONOS device.
Figure 1B:
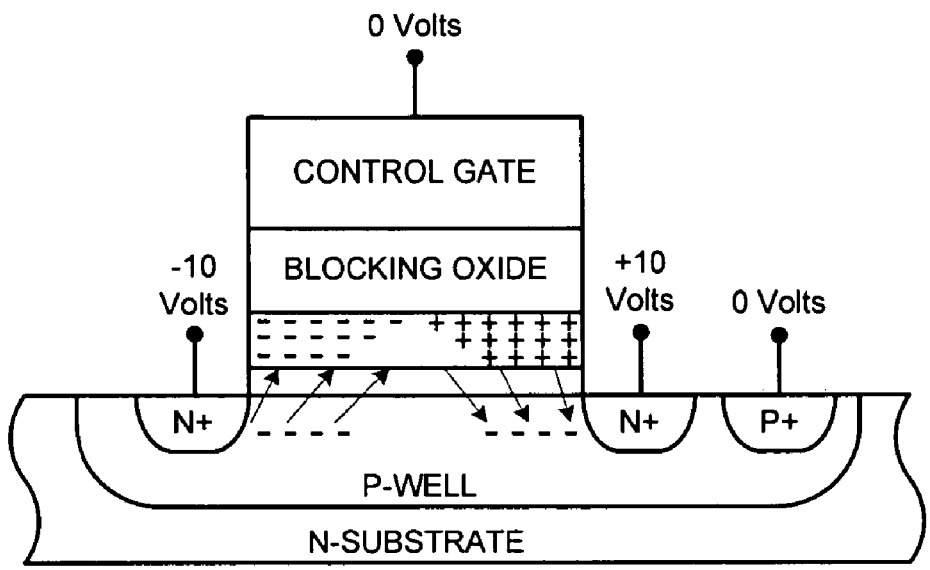
FIGS. 1B and 1C illustrate conventional 2-bit SONOS programming in a conventional SONOS device.
Figure 1C:
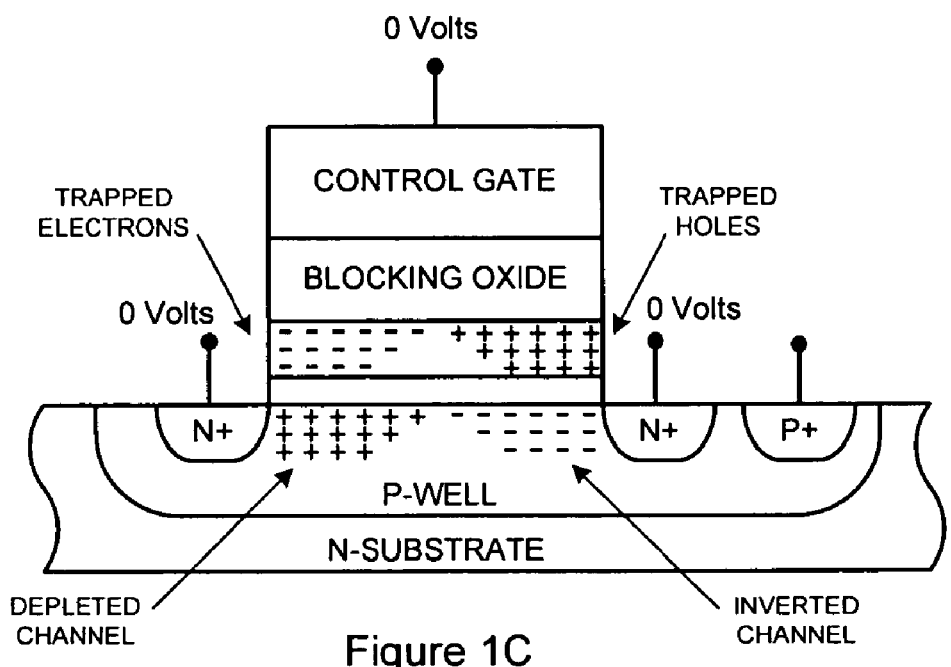
Figure 2A:
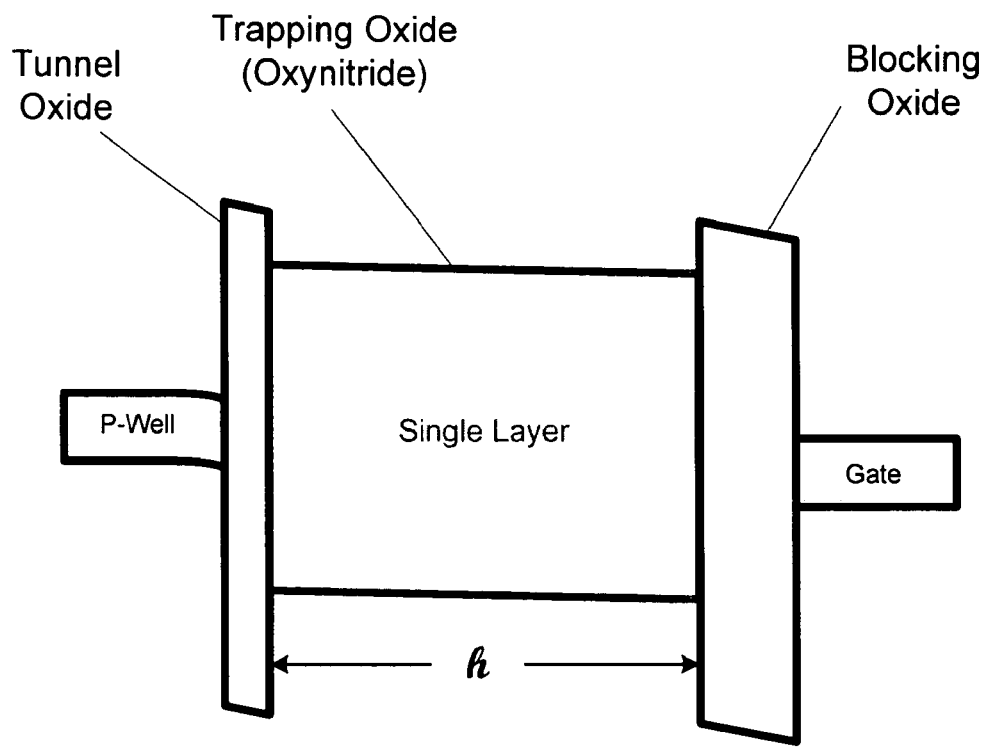
FIG. 2A illustrates an energy band diagram of a conventional SONOS device.
Figure 2B:
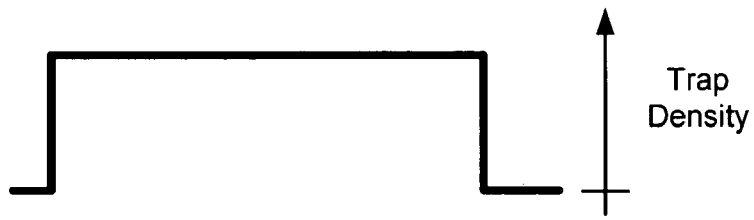
FIG. 2B illustrates the distribution of traps in the trapping layer of a conventional SONOS device.
Figure 2C:
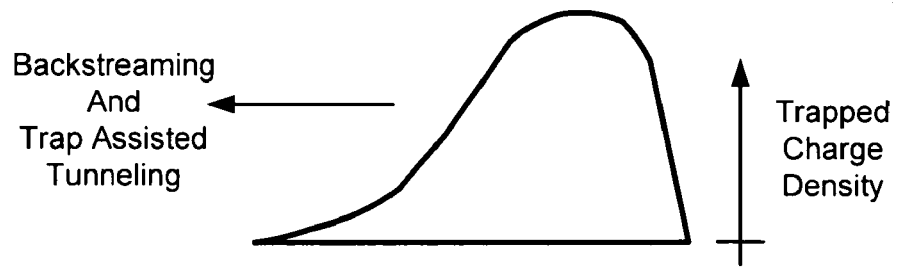
FIG. 2C illustrates trapped charge density distribution in a conventional SONOS device and charge loss due to back-streaming and trap-assisted tunneling.
Figure 5:
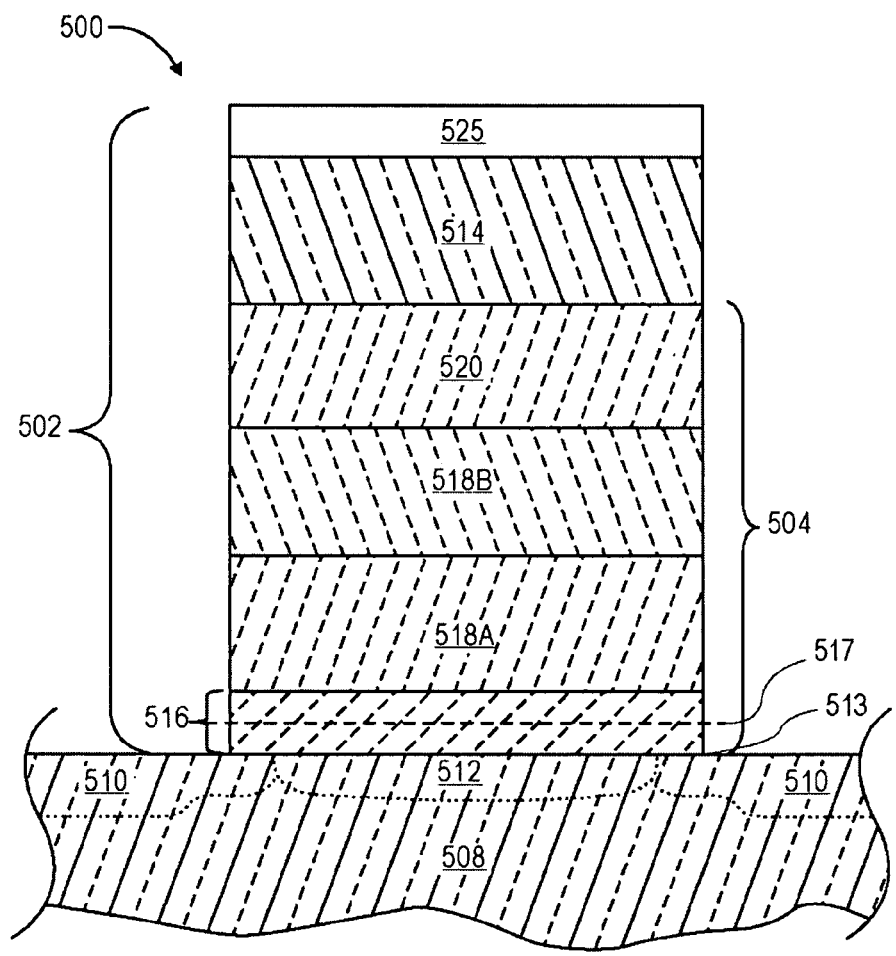
FIG. 5 illustrates the structure a SONOS device having a bi-layer oxynitride charge-trapping layer in one embodiment.

FIG. 5 illustrates a cross-sectional view of the structure of a SONOS-type device 500 having an ONO stack with a bilayer oxynitride trapping layer according to an embodiment of the present invention. The fabrication of a SONOS-type device, such as SONOS-type device 500 is described in detail in U.S. patent application Ser. No. 11/904,506, filed Sep. 26, 2007. The structure and function of the SONOS-type device 500 is described herein.

In the embodiment illustrated in FIG. 5, the SONOS-type device 500 includes a SONOS gate stack 502 including an ONO stack 504 formed over a surface 506 of a substrate 508. SONOS-type device 500 further includes one or more source and drain regions 510, aligned to the gate stack 502 and separated by a channel region 512. Generally, the SONOS gate stack 502 includes a gate layer 514 formed upon and in contact with the ONO stack 504 and a portion of the substrate 508. The gate layer 514 is separated or electrically isolated from the substrate 508 by the ONO stack 504.

In one embodiment, substrate 508 is a bulk substrate comprised of a single crystal of a material which may include, but is not limited to, silicon, germanium, silicon-germanium or a III-V compound semiconductor material. In another embodiment, substrate 508 is comprised of a bulk layer with a top epitaxial layer. In a specific embodiment, the bulk layer is comprised of a single crystal of a material which may include, but is not limited to, silicon, germanium, silicon/germanium, a III-V compound semiconductor material and quartz, while the top epitaxial layer is comprised of a single crystal layer which may include, but is not limited to, silicon, germanium, silicon/germanium and a III-V compound semiconductor material. In another embodiment, substrate 508 is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOI) semiconductor substrate), germanium, silicon/germanium and a III-V compound semiconductor material. The insulator layer is comprised of a material which may include, but is not limited to, silicon dioxide, silicon nitride and silicon oxy-nitride. The lower bulk layer is comprised of a single crystal which may include, but is not limited to, silicon, germanium, silicon/germanium, a III-V compound semiconductor material and quartz. Substrate 508 and, hence, the channel region 512 between the source and drain regions 510, may comprise dopant impurity atoms. In a specific embodiment, the channel region is doped P-type and, in an alternative embodiment, the channel region is doped N-type.

Source and drain regions 510 in substrate 508 may be any regions having opposite conductivity to the channel region 512. For example, in accordance with an embodiment of the present invention, source and drain regions 510 are N-type doped while channel region 512 is P-type doped. In one embodiment, substrate 508 is comprised of boron-doped single-crystal silicon having a boron concentration in the range of $1 \times 10^{15}$-$1 \times 10^{19}$ atoms/cm$^3$. Source and drain regions 510 are comprised of phosphorous—or arsenic-doped regions having a concentration of N-type dopants in the range of $5 \times 10^{16}$-$5 \times 10^{19}$ atoms/cm$^3$. In a specific embodiment, source and drain regions 510 have a depth in substrate 508 in the range of 80-200 nanometers. In accordance with an alternative embodiment of the present invention, source and drain regions 510 are P-type doped while the channel region of substrate 508 is N-type doped.

The SONOS-type device 500 further includes, over channel region 512, a gate stack 502 including an ONO stack 504, a gate layer 514 and a gate cap layer 525. The ONO stack 504 further includes tunneling layer 516, a charge trapping layer 518 and a blocking layer 520.

In an embodiment, the tunneling layer 516 includes a nitridized oxide. Because programming and erase voltages produce large electric fields across a tunneling layer, on the order of $10^6$ V/cm, the program/erase tunneling current is more a function of the tunneling layer barrier height than the tunneling layer thickness. However, during retention, there is no large electric field present and so the loss of charge is more a function of the tunneling layer thickness than barrier height. In one embodiment, the tunneling layer 516 is a nitridized oxide. Nitridation increases the relative permittivity or dielectric constant ($\in$) of the tunneling layer by inducing nitrogen to an otherwise pure silicon dioxide film. In certain embodiments, the tunneling layer 516 of nitridized oxide has the same physical thickness as a conventional SONOS-type device employing pure oxygen tunnel oxide. In particular embodiments, nitridation provides a tunnel layer with an effective ($\in$) between 4.75 and 5.25, preferably between 4.90 and 5.1 (at standard temperature). In one such embodiment, nitridation provides a tunnel layer with an effective ($\in$) of 5.07, at standard temperature.

In certain embodiments, the nitridized tunnel oxide of the SONOS-type device has the same physical thickness as a conventional SONOS device employing pure oxygen tunnel oxide. Generally, the higher permittivity of the nitridized tunnel oxide results in the memory layer charging faster. In such embodiments, the charge trapping layer 518 charges during program/erase faster than a pure oxygen tunnel oxide of that thickness because relatively less of the large electric field from the control gate is dropped across the nitridized tunnel oxide (due to the relatively higher permittivity of nitridized tunnel oxide). These embodiments allow the SONOS-type device 500 to operate with a reduced program/erase voltage while still achieving the same program/erase threshold voltage magnitudes (VTP/VTE) as a conventional SONOS-type device, and to operate at conventional program/erase voltages to achieve higher program/erase threshold voltage magnitudes than a conventional SONOS-type device. In a particular embodiment, the SONOS-type device 500 employs a tunneling layer 516 having nitridized tunnel oxide with a physical thickness between 1.5 nm and 3.0 nm, and preferably between 1.9 nm and 2.2 nm.

In one embodiment, the tunneling layer 516 is nitridized in a particular manner, described in U.S. patent application Ser. No. 11/904,506, to reduce the trap density at the substrate interface to improve charge retention by reducing trap assisted tunneling. The charge trapping layer 518 of the SONOS-type device 500 may further include any commonly known charge trapping material and have any thickness suitable to store charge and modulate the threshold voltage of the device. In certain embodiments, charge trapping layer 518 is silicon nitride ($Si_3N_4$), silicon-rich silicon nitride, or silicon-rich silicon oxynitride. In one particular embodiment, the charge trapping layer 518 has a non-uniform stoichiometry across the thickness of charge trapping layer. For example, the charge trapping layer 518 may further include at least two oxynitride layers having differing compositions of silicon, oxygen and nitrogen. Such compositional nonhomogeneity within the charge trapping layer has a number of performance advantages over a conventional SONOS charge trapping layer having a substantially homogeneous composition. For example, reducing the thickness of the conventional SONOS charge trapping layer increases the trap to trap tunneling rate, resulting in a loss of data retention. However, when the stoichiometry of the charge trapping layer is modified in accordance with an embodiment of the present invention, the thickness of the charge trapping layer may be scaled down while still maintaining good data retention.

In a particular embodiment, the bottom oxynitride layer 518A provides a local region within the charge trapping layer having a relatively lower density of trap states, thereby reducing the trap density at the tunnel oxide interface to reduce trap assisted tunneling in the SONOS-type device. In one such embodiment, the bottom oxynitride 518A has a first composition with a high silicon concentration, a high oxygen concentration and a low nitrogen concentration to provide an oxygen-rich oxynitride. This first oxynitride may have a physical thickness between 2.5 nm and 4.0 nm corresponding to an EOT of between 1.5 nm and 5.0 nm. In one particular embodiment, the bottom oxynitride layer 518A has an effective dielectric constant ($\in$) of approximately 6.

In a further embodiment, a top oxynitride layer 518B provides a local region within the charge trapping layer having a relatively higher density of trap states. Thus, the higher density of trap states has the effect of increasing the difference between programming and erase voltages of memory devices for a particular charge trapping layer thickness, allowing the charge trapping layer thickness to be reduced and thereby reducing the EOT of the ONO stack in the SONOS-type device. In a particular embodiment, the composition of the top oxynitride layer has a high silicon concentration and a high nitrogen concentration with a low oxygen concentration to produce a silicon-rich, oxygen-lean oxynitride. Generally, the higher silicon content of the top oxynitride, the higher the density of trap states provided by the top oxynitride and the more the top oxynitride layer thickness can be reduced (thereby reducing the charge trapping layer thickness to enable lower voltage operation). Furthermore, the higher the silicon content, the greater the permittivity and the lower the EOT for the top oxynitride layer. This reduction in EOT may more than offset the increase in EOT of the oxygen-rich bottom oxynitride, for a net reduction in EOT of the charge trapping layer relative to conventional oxynitride charge trapping layers having a substantially homogeneous composition. In one such embodiment, the top oxynitride an effective dielectric constant of approximately 7.

Figure 6A:
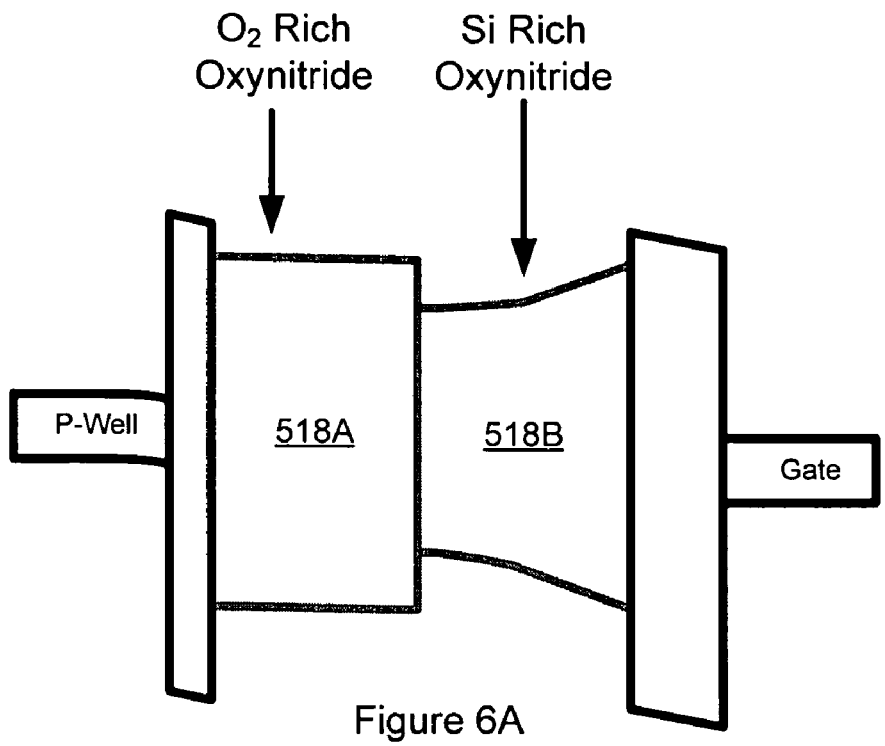
FIG. 6A illustrates an energy band diagram of a SONOS-type device having a bilayer nitride trapping layer in one embodiment.
Figure 6B:
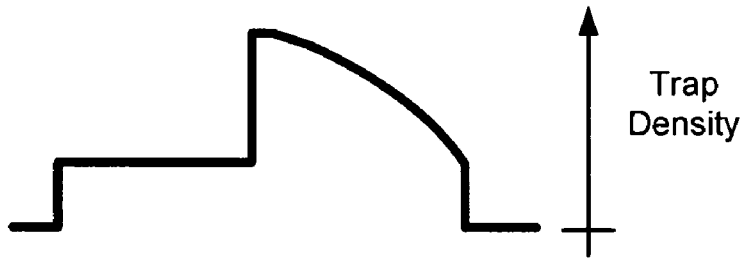
FIG. 6B illustrates a distribution of traps in a bilayer nitride trapping layer of a SONOS-type device in one embodiment.
Figure 6C:
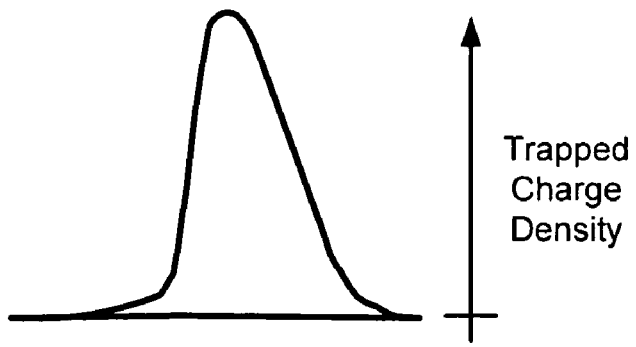
FIG. 6C illustrates a trapped charge density distribution in a bilayer nitride trapping layer in a SONOS-type device in one embodiment.

FIG. 6A is an energy band diagram associated with an oxygen-rich bottom oxynitride layer 518A and a silicon-rich top oxynitride layer 518B in one embodiment. FIG. 6B illustrates a relatively low density of traps in the oxygen-rich oxynitride layer 518A and a relatively high density of traps in the silicon-rich oxynitride layer 518B. FIG. 6C illustrates a resulting density of trapped charge (e.g., holes or electrons) localized to the interface of the oxygen-rich oxynitride layer 518A and the silicon-rich oxynitride layer 518B.

The relative density of traps through the oxynitride layers 518A and 518B, and the resulting localized trapped charge density, provide for an increased charge storage capacity, relative to a conventional SONOS device, that supports uniform multilevel programming.

Figure 7A:
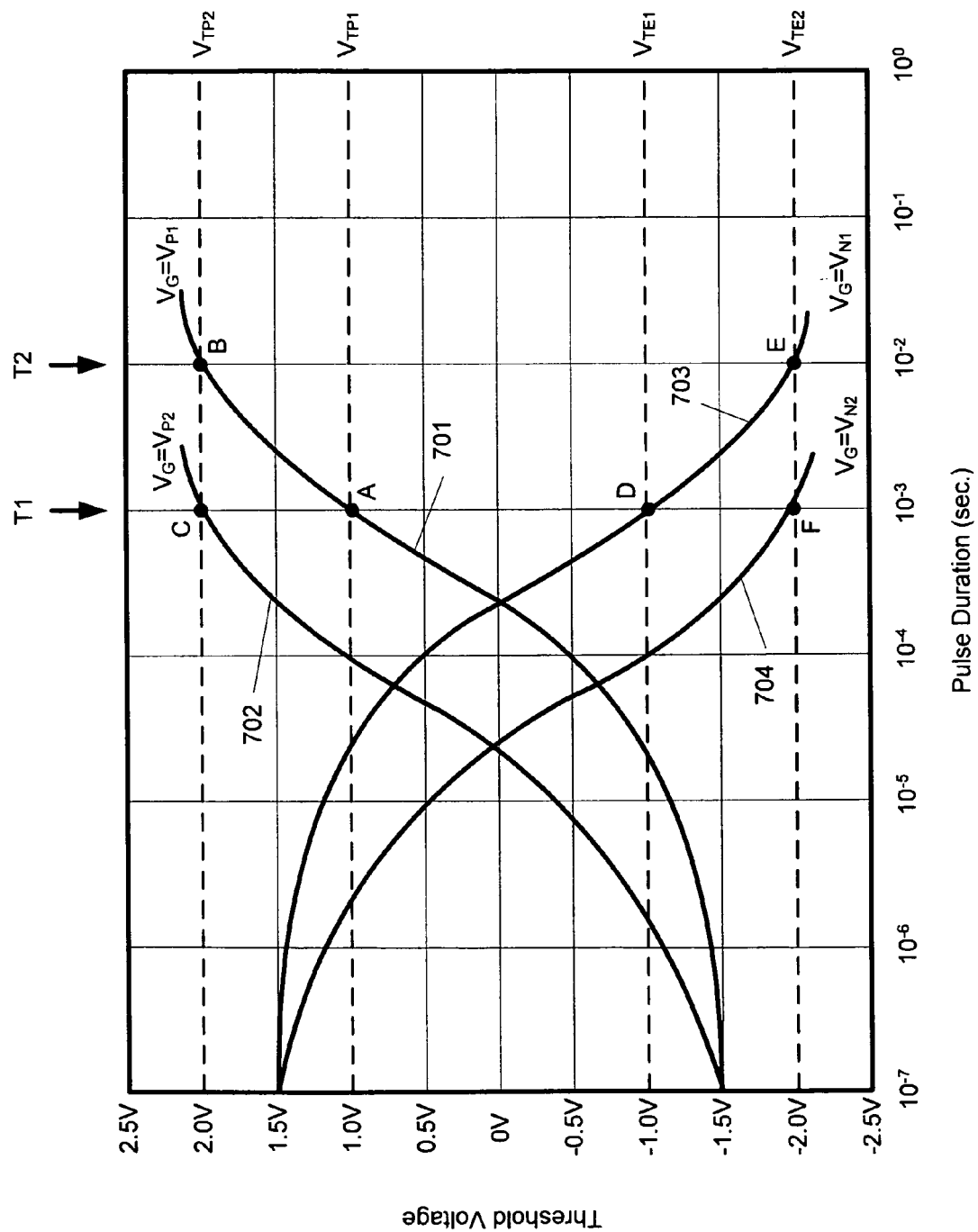
FIG. 7A illustrates multilevel program and erase threshold voltages in one embodiment.

FIG. 7A is a graph illustrating multilevel programming and erase profiles in a bi-nitride layer SONOS-type device (e.g., device 500) in one embodiment. In FIG. 7A, curve 701 illustrates the application of a first positive gate programming voltage $V_G=V_{P1}$ and the resultant change in threshold voltage as a function of time from an erased state (negative threshold voltage) to a first programmed threshold voltage ($V_{TP1}$ at point A) at time $T_1$ and to a second programmed threshold voltage ($V_{TP2}$ at point B) at time $T_2$. In one embodiment, $V_{P1}$ may be approximately 8 volts, time $T_1$ may be approximately 1 millisecond and time $T_2$ may be approximately 10 milliseconds. Curve 702 illustrates the application of a second positive gate programming voltage $V_G=V_{P2}>V_{P1}$ and the resultant change in threshold voltage as function of time from the erased state to the second programmed threshold voltage ($V_{TP2}$ at point C) at time $T_1$. In one embodiment, $V_{P2}$ may be approximately 10 volts. FIG. 8A illustrates a uniform trapped electron density distribution $-\rho_1$ corresponding to point A in FIG. 7A and FIG. 8B illustrates a uniform trapped electron density distribution corresponding to either of points B or C in FIG. 7A.

Returning to FIG. 7A, curve 703 illustrates the application of a first negative gate programming voltage $V_G=V_{N1}$ and the resultant change in threshold voltage as a function of time from a programmed state (positive threshold voltage) to a first erased threshold voltage ($V_{TE1}$ at point D) at time $T_1$ and to a second erased threshold voltage ($V_{TE2}$ at point E) at time $T_2$. In one embodiment, $V_{N1}$ may be approximately $-8$ volts. Curve 704 illustrates the application of a second negative gate programming voltage $V_G=V_{N2}$ where $|V_{N2}|>|V_{N1}|$, and the resultant change in threshold voltage as function of time from the programmed state to the second erased threshold voltage ($V_{TE2}$ at point F) at time $T_1$. In one embodiment, $V_{N2}$ may be approximately $-10$ volts. FIG. 8C illustrates a uniform trapped hole density distribution $+\rho_1$ corresponding to point D in FIG. 7A and FIG. 8D illustrates a uniform trapped hole density distribution corresponding to either of points E or F in FIG. 7A. As illustrated in FIGS. 8A through 8D, the four distinct multilevel charge densities may be associated with the 2-bit data values "00," "01," "10" and "11."

As illustrated in FIG. 7A, the difference between $V_{TP1}$ and $V_{TE1}$ may be approximately 2 volts and the difference between $V_{TP2}$ and $V_{TE2}$ may be greater than 3.5 volts and in one embodiment may be approximately 4 volts.

Figure 7B:
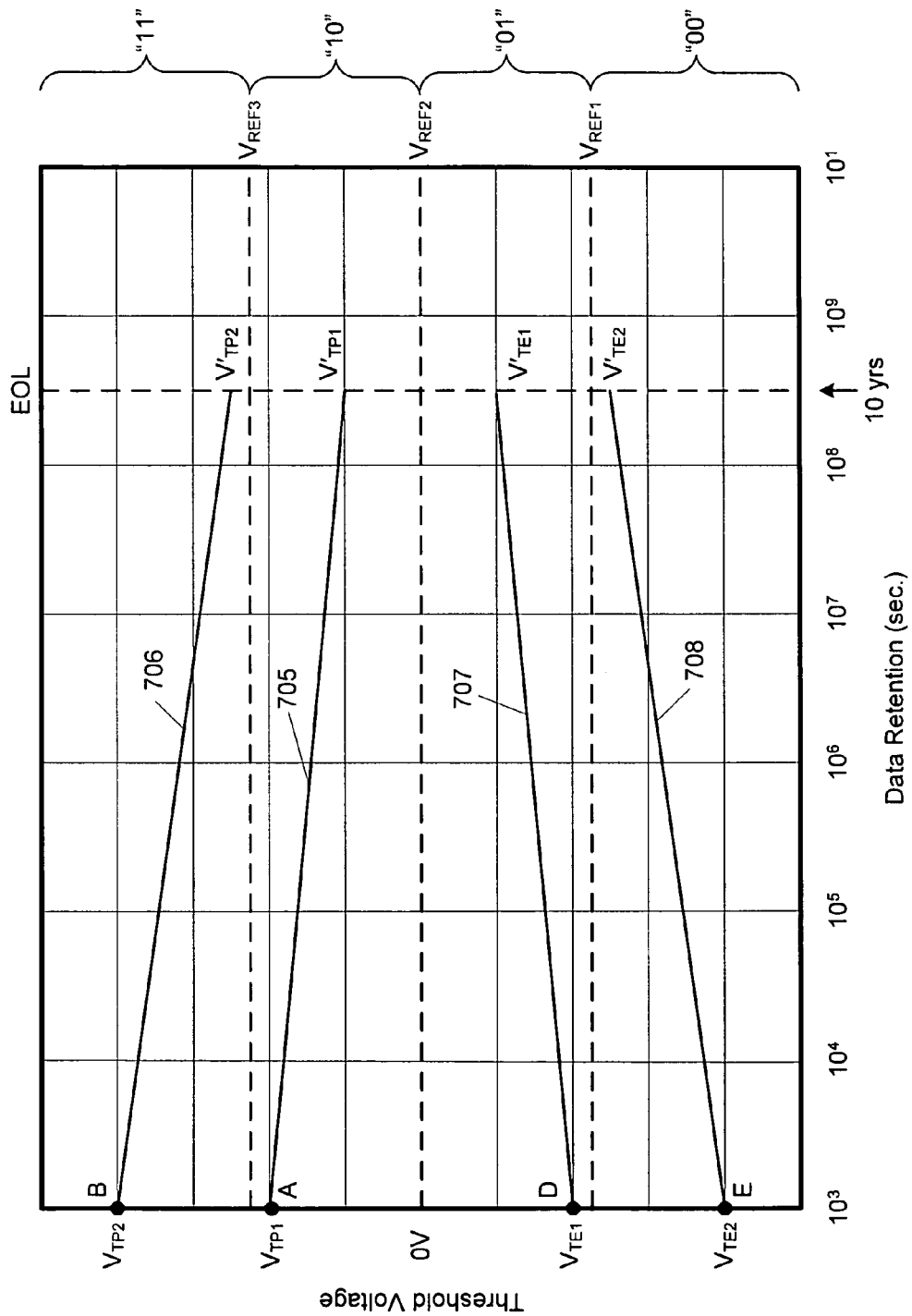
FIG. 7B illustrates multilevel data retention in one embodiment.

FIG. 7B illustrates the data retention characteristics in one embodiment of a bi-nitride layer SONOS-type device having four different initial threshold voltages $V_{TE2}$, $V_{TE2}$, $V_{TP1}$ and $V_{TP2}$ and four different end-of-life (EOL) values $V'_{TE2}$, $V'_{TE2}$, $V'_{TP1}$ and $V'_{TP2}$ corresponding to assigned data states of "00," "01," "10" and "11." It will be appreciated that the selected correspondence of a particular threshold voltage to a particular data state is arbitrary. In FIG. 7B, curve 705 illustrates a data retention characteristic of the "11" data state, curve 706 illustrates the data retention characteristic of the "10" data state, curve 707 illustrates the data retention characteristic of the "01" data state and curve 708 illustrates the data retention characteristic of the "00" data state.

Each of curves 705, 706, 707 and 708 exhibit a change from an initial threshold voltage corresponding to charge leakage from the bi-nitride trapping layer to the channel of the SONOS-type device, which leakage is minimized by the distribution of traps and trapped charge density distributions as described above. The state of the SONOS-type device may be determined by sensing which of four memory windows the threshold voltage occupies. The four memory windows may be defined by three reference voltages $V_{REF1}$, $V_{REF2}$ and $V_{REF3}$ as illustrated in FIG. 7B. The exemplary SONOS-type device characterized by FIG. 7B is in a "11" data state if the threshold voltage is greater than $V_{REF3}$. The SONOS-type device is in a "10" state if the threshold voltage is less than $V_{REF3}$ and greater than $V_{REF2}$. The SONOS-type device is in a "01" state if the threshold voltage is less than $V_{REF2}$ and greater than $V_{REF1}$. The SONOS-type device is in a "00" state if the threshold voltage is less than $V_{REF1}$. Voltage $V_{REF1}$ may be selected to be greater than the EOL value of curve 708 and less than the initial value of curve 707. Voltage $V_{REF2}$ may be selected to be greater than the EOL value of curve 707 and less than the EOL value of curve 706. Voltage $V_{REF3}$ may be selected to be greater than the initial value of curve 706 and less than the EOL value of curve 705. In one embodiment, the difference between the EOL value $V'_{TP1}$ and the EOL value $V'_{TE1}$ may be approximately 1 volt, and the difference between the EOL value $V'_{TP2}$ and the EOL value $V'_{TE2}$ may be greater than approximately 2 volts.

Figure 9A:
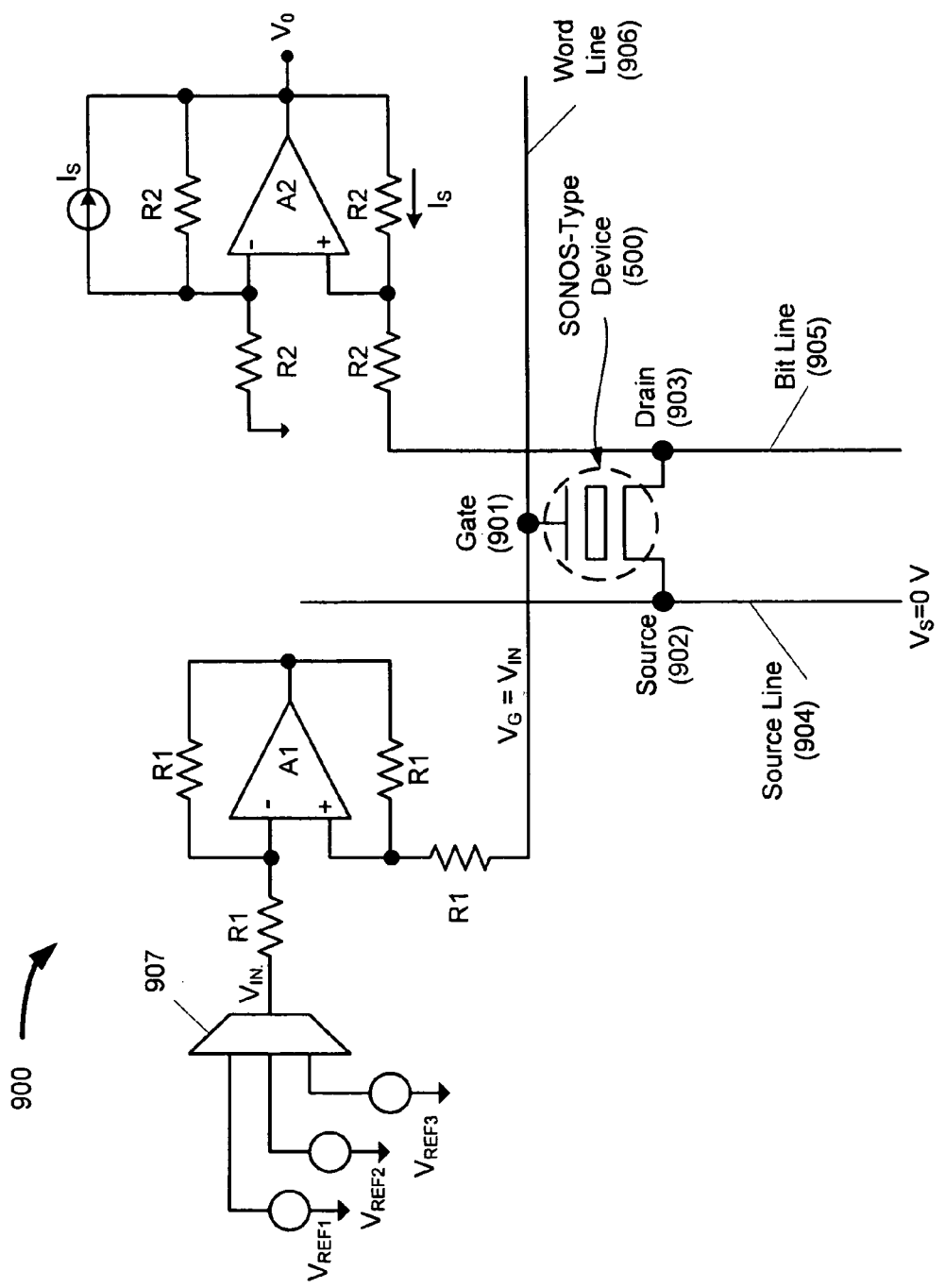
FIG. 9A illustrates a memory cell and sense circuitry in one embodiment.

FIG. 9A illustrates a circuit 900 including a memory cell and one embodiment of associated circuitry for reading the memory cell. The memory cell may include a SONOS-type device 500 having a gate 901 connected to a word line 906, a source 902 connected to a source line 904 and a drain 903 connected to a bit line 905. The general operation of memory cells having word, source and bit lines is known in the art and, accordingly, is not described in detail.

In one embodiment, word line 906 may be selectively connected to an operational amplifier circuit including a high gain differential amplifier A1 and a configuration of equal-valued resistors R1. In one embodiment, resistors R1 may be matched MOS transistors biased in a linear operating region with the same drain-to-source resistance. The high gain of differential amplifier A1 forces the inverting (−) and non-inverting (+) inputs of amplifier A1 to be equal and the configuration of equal-valued resistors R1 forces the voltage $V_G$ on the gate 501 of device 500 to equal voltage $V_{IN}$. Voltage $V_{IN}$ may be selected on successive clock cycles by a multiplexer 907 to be one of the three reference voltages $V_{REF1}$, $V_{REF2}$ or $V_{REF3}$. With the source line 904 selectively grounded as illustrated in FIG. 9, the selected reference threshold voltage will be applied from gate to source of device 500.

In one embodiment, bit line 905 may be selectively connected to a second high gain differential amplifier A2, a configuration of equal-valued resistors R2 (which may also be matched MOS transistors as described above) and a current source 908 having a value $I_S$. The value of resistors R2 may be the same value as resistors R1 or a different value. The high gain of differential amplifier A2 forces the inverting (−) and non-inverting (+) inputs of amplifier A2 to be equal. The configuration of equal-valued resistors R2, current source 908 and differential amplifier A2 will operate to mirror the current $I_S$ on bit line 905. If SONOS-type device 500 is turned on by voltage $V_G$, then current $I_S$ will flow through device 500 and the output voltage $V_O$ of operational amplifier A2 will be approximately zero (e.g., a logical zero). If device 500 is not turned on by voltage $V_G$, then current will not flow through device 500 and the output voltage $V_O$ of operational amplifier A2 will be driven high (e.g., a logical one).

Therefore, the data state of device 500 may be read by sequencing voltage $V_G$ from $V_{REF1}$ to $V_{REF2}$ to $V_{REF3}$ and observing the behavior of $V_O$. If $V_O$ is a logical zero when $V_G=V_{REF1}$, then device 500 is in the "00" data state. If $V_O$ is a logical one and switched to a logical zero when $V_G$ changes to $V_{REF2}$, then device 500 is in a "01" data state. If $V_O$ remains a logical one and switches to a logical zero when $V_G$ changes to $V_{REF3}$, then device 500 in a "10" data state. If $V_O$ remains a logical one when $V_G$ changes to $V_{REF3}$, then device 500 is in a "11" data state. FIG. 9 illustrates only one exemplary circuit and method for reading a multilevel data storage device. Other circuits and methods as are known in the art are also contemplated as embodiments of the present invention. For example, multiplexer 907 and voltage sources $V_{REF1}$, $V_{REF2}$ and $V_{REF3}$ may be replaced with a single variable voltage source.

Figure 9B:
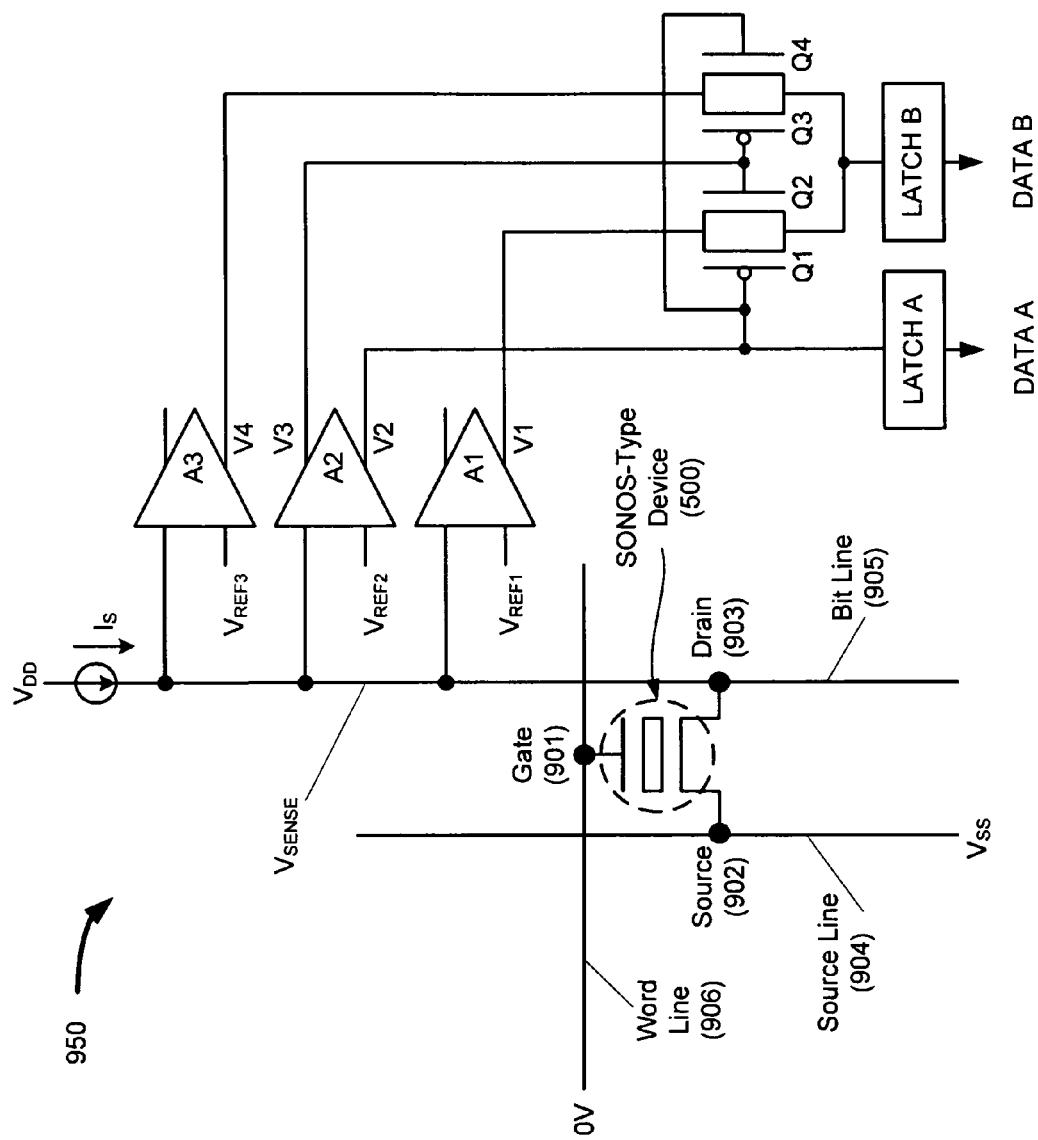
FIG. 9B illustrates a memory cell and sense circuitry in another embodiment.

FIG. 9B illustrates a circuit 950 including a memory cell as described above and another embodiment of associated circuitry for reading the memory cell. In one embodiment, word line 906 may be selectively connected to ground or o volt potential, source line 904 may be selectively connected to a negative supply voltage $V_{SS}$ and bit line 905 may be selectively connected to a current source $I_S$ in series with a positive supply voltage $V_{DD}$. Current source $I_S$ will drive the bit line voltage to a value $V_{SENSE}$ between $V_{DD}$ and $V_{SS}$ that is required for $I_S$ to flow through the memory cell, such that $V_{SENSE}$ will be approximately equal to the threshold voltage corresponding to the state of the memory cell. That is, $V_{SENSE}$ will have one of the four values $V_{TE2}$, $V_{TE2}$, $V_{TP1}$ and $V_{TP2}$ corresponding to the two erased states and the two programmed states of the memory cell.

Sense amplifiers SA1, SA2 and SA3 may be connected in parallel to bit line and each sense amplifier may be referenced to a respective reference voltages $V_{REF1}$, $V_{REF2}$ and $V_{REF3}$, where $(V_{TE2}<V_{REF1})$, $(V_{REF1}<V_{TE1}<V_{REF2})$, $(V_{REF2}<V_{TP1}<V_{REF3})$, and $(V_{REF3}<V_{TP2})$. Each sense amplifier may have an inverting output that is high when $V_{SENSE}$ is lower than its reference voltage and is low when $V_{SENSE}$ is higher than its reference voltage. As illustrated in FIG. 9B, inverting outputs V1, V2 and V4, and non-inverting output V3 are connected to a four line, two bit decoder configured from two PMOS transistors Q1 and Q3 and two NMOS transistors Q2 and Q4. The operation of decoders is known in the art and is not described in detail. The outputs of the decoder may be latched into latches A and B, which may be read as DATA "A" and DATA "B" respectively. FIG. 9C is a truth table illustrating the values of DATA "A" and DATA "B" as a function of $V_{SENSE}$.

In other embodiments, other current sensing or voltage sensing sense amplifier circuits, as are known in the art, may be combined with device 500 to read the data state of device 500.

Figure 10:
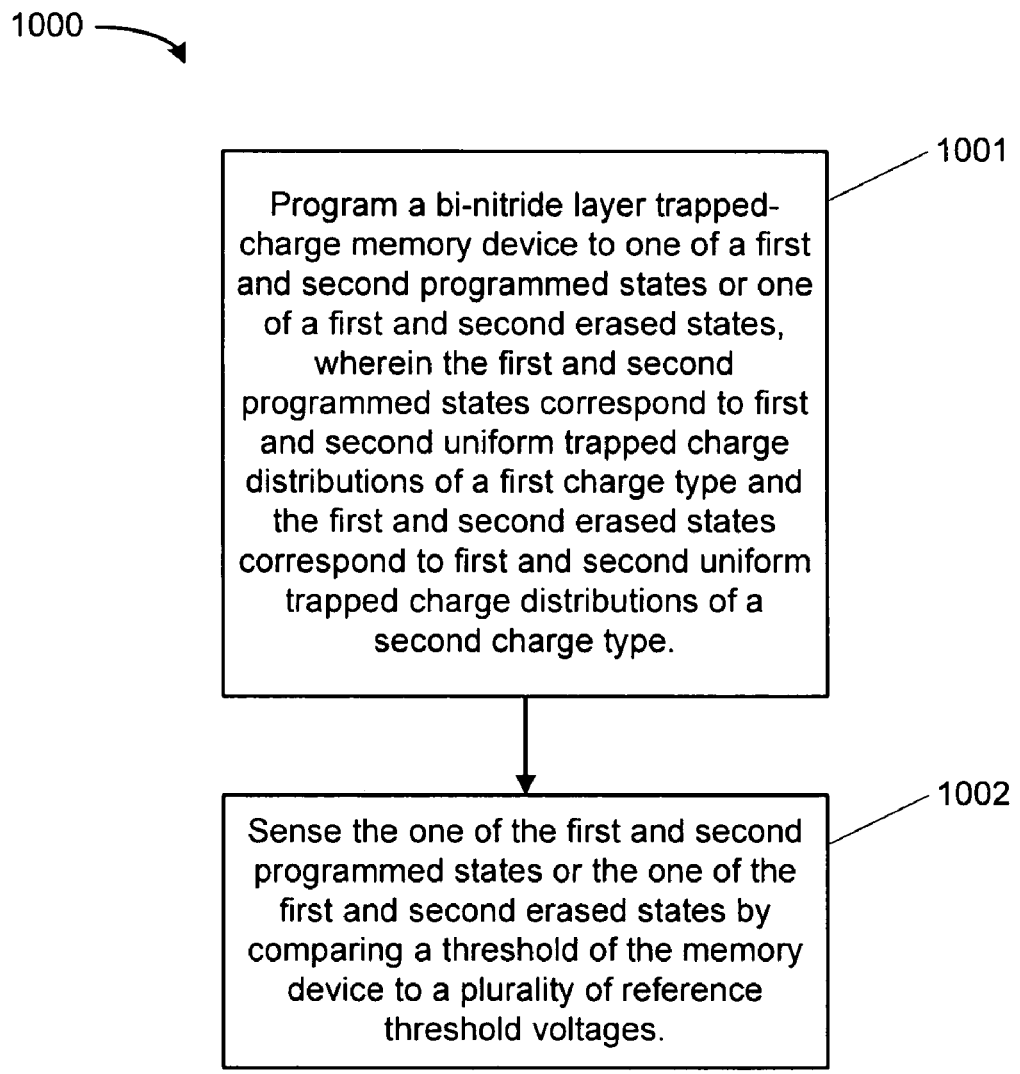
FIG. 10 is a flowchart illustrating a method for multilevel programming and sensing in one embodiment.

FIG. 10 is a flowchart 1000 illustrating a method in one embodiment for multilevel programming of a bi-nitride trapping layer SONOS-type device. In a first operation (operation 1001), the SONOS-type device is programmed to one of a first and second programmed states or one of a first and second erased states, where the first and second programmed states correspond to first and second uniform trapped charge distributions of a first charge type and the first and second erased states correspond to first and second uniform trapped charge distributions of a second charge type. In a second operation (operation 1002), the one of the first and second programmed states or the one of the first and second erased states is sensed by comparing a threshold of the memory device to a plurality of reference voltages.

Figure 11:
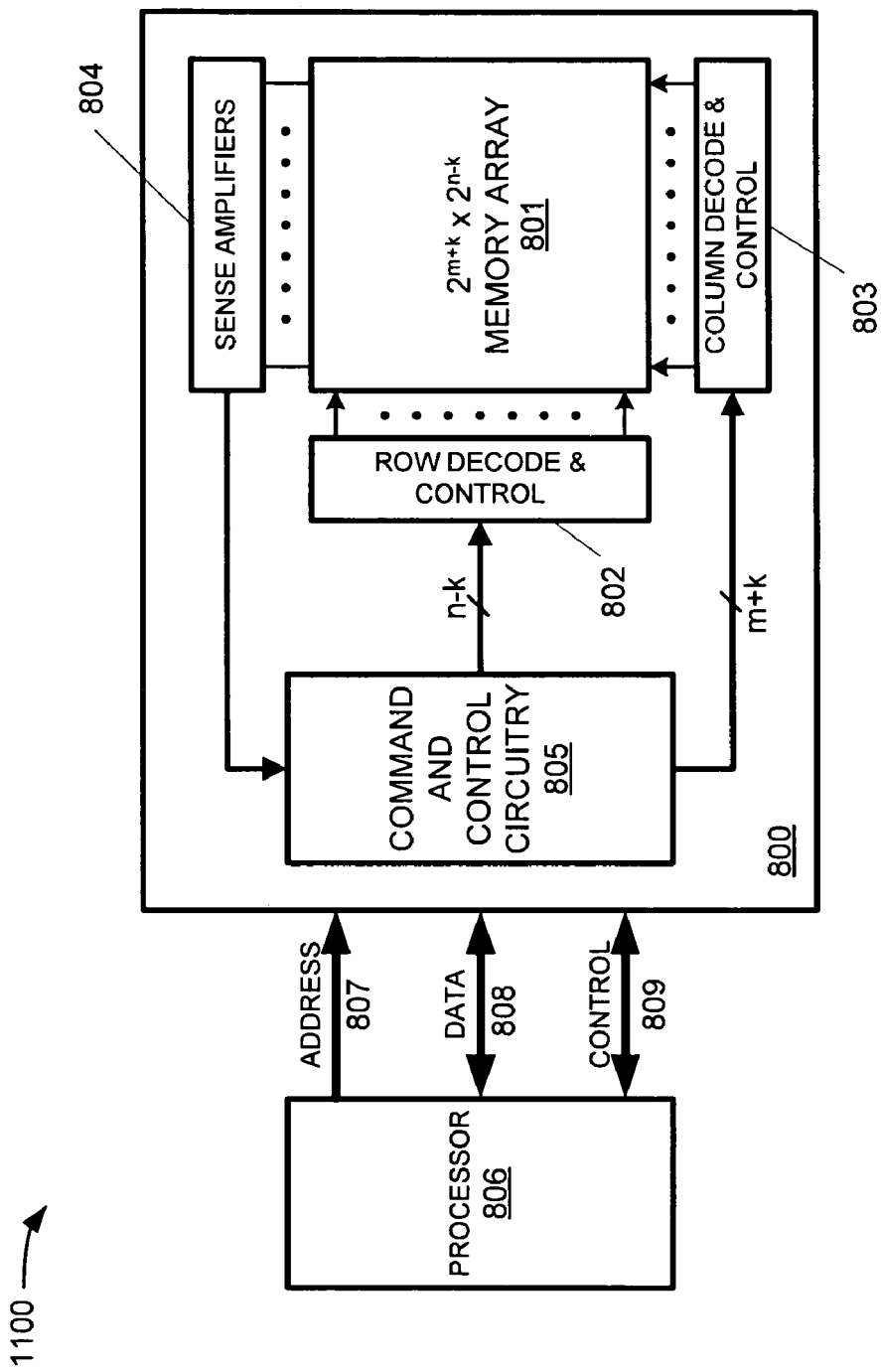
FIG. 11 is a block diagram illustrating a multilevel memory system in one embodiment.

FIG. 11 is a block diagram of processing system 1100 including a SONOS-type memory 800 according to one embodiment of the invention. In FIG. 11, the SONOS-type memory 800 includes a SONOS-type memory array 801, which may be an organized as rows and columns of SONOS-type memory devices such as device 500 described above. In one embodiment, memory array 801 may be an array of $2^{m+k}$ columns by $2^{n-k}$ rows of memory devices where k is the length of a data word in bits. Memory array 801 may be coupled to a row decoder and controller 802 via $2^{n-k}$ word lines. Memory array 801 may also be coupled to a column decoder and controller 802 via $2^{m+k}$ source lines and by $2^{m+k}$ bit lines. Row and column decoders and controllers are known in the art and, accordingly, are not described in detail herein. Memory array 801 may also be coupled to a plurality of sense amplifiers 804 as are known in the art to read k-bit words from memory array 801. Memory 800 may also include command and control circuitry 805, as is known in the art, to control row decoder and controller 802, column decoder and controller 803 and sense amplifiers 804, and also to receive read data from sense amplifiers 804.

Memory 800 may also be coupled to a processor 806 in a conventional manner via an address bus 807, a data bus 808 and a control bus 809. Processor 806 may be any type of general purpose or special purpose processing device, for example.

In one embodiment, row controller 802 may be configured to select a row of the memory array 801 for a write operation. The column controller 803 may be configured to select a memory device in the first row for programming. The column controller 803 may be configured to apply a first programming voltage for a first time period to program the memory device to a first programmed state, or a second time period greater than the first time period to program the memory device to a second programmed state. The column controller may also be configured to apply a second programming voltage, greater than the first programming voltage, for the first time period, to program the memory device to the second programmed state.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method, comprising:
   programming a bi-nitride layer trapped-charge memory device to one of first and second programmed states, corresponding to first and second threshold voltages, or one of first and second erased states, corresponding to third and fourth threshold voltages, wherein the first and second threshold voltages correspond to first and second uniform trapped charge distributions of a first charge type and the third and fourth threshold voltages correspond to first and second uniform trapped charge distributions of a second charge type; and
   sensing the one of the first and second programmed states or the one of the first and second erased states.

2. The method of claim 1, wherein programming the memory device to the first programmed state comprises one of applying a first programming voltage for a first time period and a second programming voltage for a second time period, and wherein programming the memory device to the first erased state comprises one of applying a first erase voltage for the first time period and a second erase voltage for the second time period.

3. The method of claim 2, wherein programming the memory device to the second programmed state comprises applying the second programming voltage for the first time period, and wherein programming the memory device to the second erased state comprises applying the second erase voltage for the first time period.

4. The method of claim 3, wherein the first programming voltage is approximately +8 volts, the second programming voltage is approximately +10 volts, the first erase voltage is approximately −8 volts, the second erase voltage is approximately −10 volts, the first time period is approximately 10 milliseconds and the second time period is approximately 1 millisecond.

5. The method of claim 4, wherein a difference between the second threshold voltage and the fourth threshold voltage is greater than or equal to approximately 3.5 volts.

6. The method of claim 4, wherein a difference between the second threshold voltage and the fourth threshold voltage at an end-of-life (EOL) of the memory device is greater than or equal to approximately 2 volts.

7. The method of claim 6, wherein the EOL of the memory device is approximately 20 years.

8. The method of claim 1, wherein sensing the one of the first and second programmed states or the one of the first and second erased states comprises:
   coupling a sense amplifier to the memory device;
   multiplexing the sense amplifier to a plurality of reference voltages, wherein each reference voltage is greater than a device threshold voltage in a first data state and less than a device threshold voltage in a second data state; and
   determining an on or off state of the memory device for each of the plurality of reference voltages.

9. The method of claim 8, wherein
   a first reference voltage is greater than an end of life (EOL) value of a first erased threshold voltage of the memory device and less then an initial value of a second erased threshold voltage of the memory device;
   a second reference voltage is greater than an EOL value of the second erased threshold voltage and less then an EOL value of a first programmed threshold voltage of the memory device; and
   a third reference voltage is greater than an initial value of the second erased threshold voltage and less then an EOL value of a second programmed threshold voltage of the memory device.

10. An apparatus, comprising:
    a bi-nitride layer trapped-charge memory device having first and second programmed threshold voltages corresponding to a first and second uniform trapped charge distribution of a first charge type and first and second erased threshold voltages corresponding to a first and second uniform trapped charge distribution of a second charge type; and
    a sense amplifier system, coupled to the memory device, configured to sense a difference between the first programmed threshold voltage and the second programmed threshold voltage, between the first programmed threshold voltage and the first erased threshold voltage and between the first erased threshold voltage and the second erased threshold voltage.

11. The apparatus of claim 10,
    wherein each of the first and second programmed threshold voltages and each of the first and second erased threshold voltages has an initial value and an end-of-life (EOL) value at the EOL of the memory device,
    wherein an initial value of the second programmed threshold voltage is greater than an initial value of the first programmed threshold voltage,
    wherein an initial value of the second erased threshold voltage is less than an initial value of the first erased threshold voltage, and
    wherein an initial value of the first programmed threshold voltage is greater than an initial value of the second erased threshold voltage.

12. The apparatus of claim 11,
    wherein the EOL value of the second programmed threshold voltage is greater than the initial value of the first programmed threshold voltage,
    wherein the EOL value of the second erased threshold voltage is less than the initial value of the first erased threshold voltage, and
    wherein the EOL value of the first programmed threshold voltage is greater than the EOL value of the first erased threshold voltage.

13. The apparatus of claim 11, further comprising a programming voltage controller, coupled to the memory device, to program the memory device to the one of the first and second programmed threshold voltages or the one of the first and second erased threshold voltages.

14. The apparatus of claim 13,
    wherein to program the memory device to the first programmed threshold voltage, the programming voltage controller is configured to apply to the memory device one of a first programming voltage for a first time period and a second programming voltage for a second time period, and
    wherein to program the memory device to the first erased threshold voltage, the programming voltage controller is configured to apply to the memory device one of a first erase voltage for a first time period and a second erase voltage for a second time period.

15. The apparatus of claim 14,
    wherein to program the memory device to the second programmed threshold voltage, the programming voltage controller is configured to apply the second programming voltage to the memory device for the first time period, and
    wherein to program the memory device to the second erased threshold voltage, the programming voltage controller is configured to apply the second erase voltage to the memory device for the first time period.

16. The apparatus of claim 15, wherein the first programming voltage is approximately +8 volts, the second programming voltage is approximately +10 volts, the first erase voltage is approximately −8 volts, the second erase voltage is approximately −10 volts, the first time period is approximately 10 milliseconds and the second time period is approximately 1 millisecond.

17. The apparatus of claim 16, wherein a difference between the initial value of the second programmed threshold voltage and the initial value of the second erased threshold voltage is greater than or equal to approximately 3.5 volts, and wherein a difference between the EOL value of the second programmed threshold voltage and the EOL value of the second erased threshold voltage is greater than or equal to approximately 2 volts.

18. The apparatus of claim 17, wherein the EOL of the memory device is approximately 20 years.

19. An apparatus, comprising:
    means for programming a bi-nitride layer trapped-charge memory device to any one of four different threshold voltages corresponding to two bits of data, wherein the four different threshold voltages include a first programmed threshold voltage, a first erased threshold voltage, a first erased threshold voltage, and a second erased threshold voltage; and
    means for sensing a difference between the first programmed threshold voltage and the second programmed threshold voltage, between the first programmed threshold voltage and the first erased threshold voltage and between the first erased threshold voltage and the second erased threshold voltage.

20. The apparatus of claim 19, wherein the means for sensing the four threshold voltages comprises means for multiplexing a plurality of reference voltages to the memory device and means for determining an on-off state of the memory device.

* * * * *